United States Patent
Kawamoto

(10) Patent No.: US 7,482,850 B2
(45) Date of Patent: Jan. 27, 2009

(54) DELAY LOCKED LOOP CIRCUIT AND SEMICONDUCTOR INTEGRATED CIRCUIT DEVICE

(75) Inventor: Takashi Kawamoto, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 42 days.

(21) Appl. No.: 11/648,652

(22) Filed: Jan. 3, 2007

(65) Prior Publication Data

US 2007/0210842 A1    Sep. 13, 2007

(30) Foreign Application Priority Data

Mar. 13, 2006    (JP) .............................. 2006-067243

(51) Int. Cl.
*H03L 7/06*    (2006.01)

(52) U.S. Cl. ...................... 327/158; 327/149; 327/150; 327/153; 327/156; 327/161

(58) Field of Classification Search .................. 327/158
See application file for complete search history.

(56) References Cited

U.S. PATENT DOCUMENTS

| | | | |
|---|---|---|---|
| 6,239,634 B1 | 5/2001 | McDonagh | |
| 6,628,154 B2 * | 9/2003 | Fiscus | ......................... 327/158 |
| 6,867,627 B1 * | 3/2005 | Murtagh | ...................... 327/158 |
| 6,989,700 B2 | 1/2006 | Kim | |
| 2003/0090296 A1 | 5/2003 | Yoo | |
| 2004/0264621 A1 | 12/2004 | Mai | |
| 2005/0231249 A1 | 10/2005 | Tani | |
| 2006/0250171 A1 * | 11/2006 | Lee | ............................. 327/158 |

FOREIGN PATENT DOCUMENTS

| | | |
|---|---|---|
| JP | 2001-056723 A | 2/2001 |
| JP | 2002-064371 A | 2/2002 |
| JP | 2005-251370 A | 9/2005 |
| JP | 2005-311543 A | 11/2005 |

OTHER PUBLICATIONS

George Chien et al., "A 900-MHz Local Oscillator using a DLL-based Frequency Multiplier Technique for PCS Application", ISSCC, 2000, p. 105.
David J. Foley et al: "CMOS DLL-Based 2-V 3.2-ps Jitter 1-GHz Clock Synthesizer and Temperature-Compensated Tunable Oscillator", IEEE Journal of solid-state circuits, vol. 36, No. 3, Mar. 2001.
European Search Report of Application No. 07000456.9-2206 dated Jun. 13, 2007.

* cited by examiner

*Primary Examiner*—Kenneth B Wells
*Assistant Examiner*—John W Poos
(74) *Attorney, Agent, or Firm*—Miles & Stockbridge P.C.

(57) ABSTRACT

A technology capable of avoiding malfunction of a delay locked loop without generating a constant phase error in a delay locked loop circuit is provided. In a delay locked loop circuit, a control circuit is disposed in the outside of a delay locked loop, and in phase comparison of the delay locked loop, the control circuit outputs a control signal to the delay locked loop so that the relation in the phase comparison between a reference signal and an output signal is shifted by a set cycle.

5 Claims, 16 Drawing Sheets

DELAY LOCKED LOOP CIRCUIT AND SEMICONDUCTOR INTEGRATED CIRCUIT DEVICE

CROSS-REFERENCE TO RELATED APPLICATION

The present application claims priority from Japanese Patent Application No. JP 2006-067243 filed on Mar. 13, 2006, the content of which is hereby incorporated by reference into this application.

TECHNICAL FIELD OF THE INVENTION

The present invention relates to a delay locked loop (DLL) circuit and a semiconductor integrated circuit device using the same. More specifically, it relates to a technology for avoiding malfunction of a delay locked loop circuit.

BACKGROUND OF THE INVENTION

According to the examination on the technologies for a delay locked loop circuit by the inventor of the present invention, for example, the following technologies are known.

In general, a delay locked loop (DLL) circuit is mounted in a semiconductor integrated circuit device to synchronize the output signals of an oscillator serving as reference signals and the operating clocks of a logic circuit for processing data. Further, in recent years, along with the increase in the operation speed of semiconductor integrated circuit devices, in order to speed up the operating clock of a logic circuit, an edge combiner type DLL which can output a multiplied clock of an input signal frequency described in "A 900-MHz Local Oscillator using a DLL-based Frequency Multiplier Technique for PCS Application" by George Chien et al., ISSCC, 2000, p. 105 (Non Patent Document 1) has been used for the delay locked loop (DLL) circuit.

It is known that countermeasures are taken in a delay locked loop so that this DLL circuit satisfies specified operations. For example, DLL malfunction avoiding technologies are disclosed in Japanese Patent Application Laid-Open Publication No. 2005-311543 (Patent Document 1), Japanese Patent Application Laid-Open Publication No. 2005-251370 (Patent Document 2), Japanese Patent Application Laid-Open Publication No. 2001-056723 (Patent Document 3), and Japanese Patent Application Laid-Open Publication No. 2002-64371 (Patent Document 4).

Patent Document 1 discloses a technology in which a control circuit is disposed between a reference clock and an input of a phase comparator and one clock of the reference clock is masked by the control circuit (for example, see FIG. 2 and others in Patent Document 1).

Patent Document 2 discloses a technology in which a comparator enable signal generator is disposed between a reference clock and an input of a phase comparator and the input of the reference clock is controlled by the comparator enable signal generator (for example, see FIG. 3 and others in Patent Document 2).

Patent Document 3 discloses a technology in which a dummy buffer is disposed between a feedback signal and an input of a phase comparator to adjust the difference in delay time from the reference clock input (for example, see FIG. 63 and others in Patent Document 3).

SUMMARY OF THE INVENTION

Incidentally, as a result of the examination on the technologies for such a delay locked loop circuit by the inventor of the present invention, the following facts have been found.

FIG. 20 and FIG. 21 show examples of the structure of a delay locked loop which has been examined as a background of the present invention. In a delay locked loop 1 shown in FIG. 20 and FIG. 21, an output signal (Fo) is required to have a delay amount equivalent to one cycle of a reference signal (Fr). For this purpose, the relation in phase comparison between the reference signal (Fr) and the output signal (Fo) in a phase frequency comparator (PFD) 11 have to be shifted by one cycle.

FIG. 22 shows a timing chart of a delay locked loop 1. In the delay locked loop 1, the rising edge (b) of the second clock of the reference signal (Fr) and the rising edge (c) of the first clock of the output signal (Fo) must be in the relation of the phase comparison. However, if the rising edge (a) of the first clock of the reference signal (Fr) and the rising edge (c) of the first clock of the output signal (Fo) are in the relation of the phase comparison, since the output signal (Fo) is faster, although the pulse width of a Dn signal must be wider than the pulse width of an Up signal, the pulse width of the Up signal becomes larger that of the Dn signal and thus a malfunction occurs.

In order to avoid this malfunction, such countermeasures as shown in FIG. 20 (first structure example) and FIG. 21 (second structure example) have been taken.

The delay locked loop 1 according to the first structure example shown in FIG. 20 is composed of a phase frequency comparator (PFD) 11, a charge pump (CP) 12, a loop filter (LF) 13, a voltage control delay line (VCDL) 14, and a control circuit (CNT) 2.

In this structure, by disposing a control circuit 2 between the reference signal (Fr) and the phase frequency comparator 11, the pulse of the first clock of the input signal (Fr) is masked and a corrected reference signal (Fr') is generated, and the phase comparison is carried out between the corrected reference signal (Fr') and the output signal (Fo). By this means, the malfunction of the delay locked loop is avoided.

FIG. 23 shows an operation example of the first structure example shown in FIG. 20. By the control circuit 2, the input signal (Fr) is converted into the corrected reference signal (Fr'). The phase frequency comparator 11 compares the corrected reference signal (Fr') and the output signal (Fo), and the rising edge (b) of the second clock of the reference signal (Fr) and the rising edge (c) of the first clock of the output signal (Fo) are brought into the relation of phase comparison.

However, a delay occurring in the control circuit 2 is added between the reference signal (Fr) and the corrected reference signal (Fr'). This delay of the control circuit 2 becomes a constant phase error for the delay locked loop, and accordingly, such a problem that a desired frequency cannot be generated and a correct lock operation cannot be performed occurs in the prior art.

Further, the delay locked loop 1 according to the second structure example shown in FIG. 21 is composed of a phase frequency comparator (PFD) 11, a charge pump (CP) 12, a loop filter (LF) 13, a voltage control delay line (VCDL) 14, a control circuit (CNT) 2, and a control circuit (CNT) 3. Also, a control circuit (CNT) 2 is disposed between the reference signal (Fr) and the phase frequency comparator 11, and a control circuit (CNT) 3 is disposed between the output signal (Fo) and the phase frequency comparator 11.

FIG. 24 shows an operation example of the second structure example shown in FIG. 21. In the second structure example, in order to avoid the constant phase error due to the delay between the reference signal (Fr) and the corrected reference signal (Fr') which becomes the problem in the first structure example, the control circuit (CNT) 3 is added, and a delay of the same time period as that of the delay between the control circuit reference signal (Fr) and the corrected reference signal (Fr') is generated between the output signal (Fo) and the corrected output signal (Fo').

However, in the control circuit (CNT) 2, between the reference signal (Fr) and the corrected reference signal (Fr'), the first one clock of the reference signal (Fr) is masked, and in the second and subsequent clocks, operations to output the reference signal (Fr) are performed. On the other hand, in the control circuit (CNT) 3, operations to output the corrected output signal (Fo') as the signal where the output signal (Fo) is delayed by a certain time period are performed.

Accordingly, since the control circuit (CNT) 2 and the control circuit (CNT) 3 perform respectively different operations, their circuit structures are different. As a result, the delay time of the control circuit (CNT) 2 does not completely match the delay time of the control circuit (CNT) 3, and consequently, the difference between the delay time of the control circuit (CNT) 2 and the delay time of the control circuit (CNT) 3 appears as the constant phase error of the delay locked loop 1.

Accordingly, an object of the present invention is to provide a technology for avoiding the malfunction of the delay locked loop without generating the constant phase error.

The above and other objects and novel characteristics of the present invention will be apparent from the description of this specification and the accompanying drawings.

The typical ones of the inventions disclosed in this application will be briefly described as follows.

That is, a delay locked loop circuit and a semiconductor integrated circuit device according to the present invention have a control circuit in the outside of the delay locked loop, and in a phase comparison of the delay locked loop, a control signal is outputted from the control circuit to the delay locked loop so that the relation of the phase comparison of the reference signal (Fr) and the output signal (Fo) is shifted by a predetermined cycle.

More specifically, a delay locked loop circuit according to the present invention comprises: a phase comparator; and a delay line which changes a delay time given to a reference signal on the basis of an output of the phase comparator and outputs a delayed reference signal as an output signal, and supplies the output signal as a feedback signal to the phase comparator, wherein the reference signal, the feedback signal from the delay line, and a control signal which controls a start timing of a phase comparison operation between the reference signal and the feedback signal performed by the phase comparator are inputted to the phase comparator, and a timing at which the reference signal is inputted to the delay line and a timing at which the reference signal is inputted to the phase comparator are substantially equal to each other.

According to the present invention, it is possible to avoid the malfunction of the delay locked loop.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
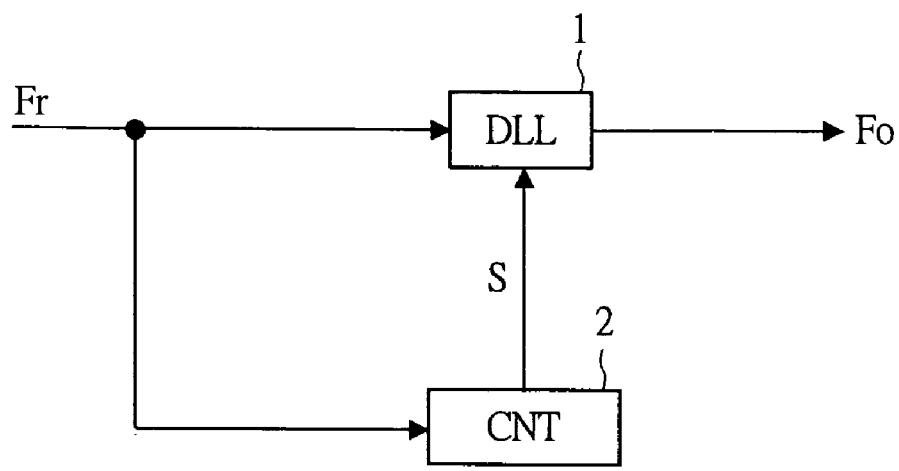
FIG. 1 is a block diagram showing a structure example of a delay locked loop circuit according to a first embodiment of the present invention.

FIG. 1 shows the structure of a delay locked loop circuit according to a first embodiment of the present invention.

The delay locked loop circuit according to the first embodiment includes at least a phase comparator 11, and a delay line 14 which changes the delay time given to a reference signal on the basis of the output of the phase comparator 11, outputs the delayed reference signal as an output signal, and supplies the output signal as a feedback signal to the phase comparator 11. In the structure thereof, the reference signal (Fr), the feedback signal from the delay line 14, and a control signal (S) which controls the start timing of the phase comparison operation between the reference signal (Fr) and the feedback signal to be performed by the phase comparator 11 are inputted to the phase comparator 11. Further, the timing at which the reference signal (Fr) is inputted to the delay line 14 and the timing at which the reference signal (Fr) is inputted to the phase comparator 11 are substantially equal to each other.

More preferably, the delay locked loop circuit is composed of a delay locked loop (DLL) 1 having a phase comparator 11 and a delay line 14 and a control circuit (CNT) 2 and others.

The delay locked loop (DLL) 1 inputs the reference signal (Fr) and the control signal (S) and outputs the output signal (Fo). The control circuit (CNT) 2 inputs the reference signal (Fr) and outputs the control signal (S).

Figure 15:
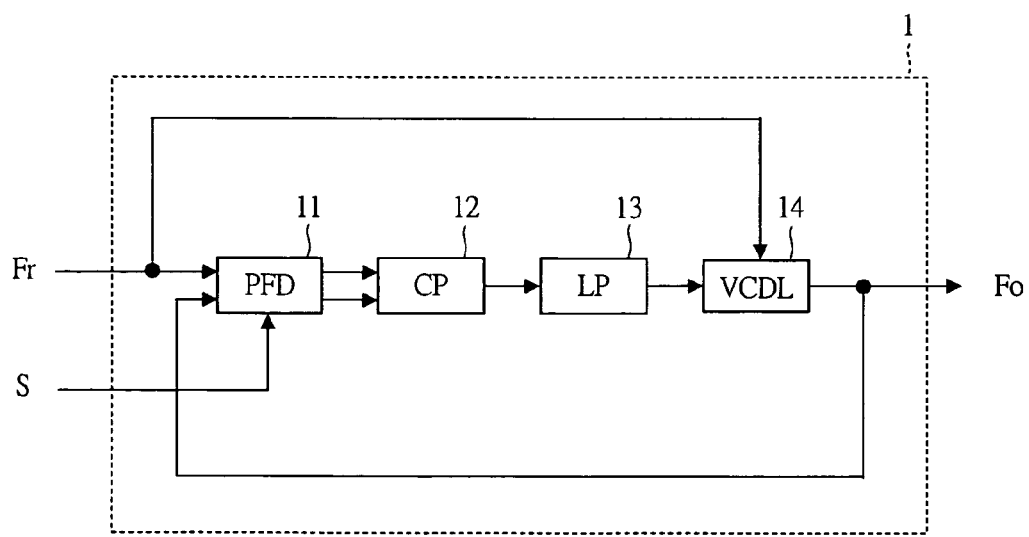
FIG. 15 is a block diagram showing a first structure example of a delay locked loop to be used in the delay locked loop circuit described in FIG. 1, FIG. 7, and FIG. 11.

FIG. 15 shows a structure example of the delay locked loop (DLL) 1 shown in FIG. 1.

This delay locked loop (DLL) 1 is composed of a phase frequency comparator (PFD) 11, a charge pump (CP) 12, a loop filter (LF) 13, a voltage control delay line (VCDL) 14 and others.

The phase frequency comparator 11 inputs the reference signal (Fr), the output signal (Fo) and the control signal (S), and the operations thereof are controlled by the control signal (S). Further, it compares the phases and frequencies of the reference signal (Fr) and the output signal (Fo) and outputs the comparison signal thereof to the charge pump 12. The charge pump 12 outputs a pulse signal in accordance with the comparison signal to the loop filter 13. The loop filter 13 converts the pulse signal into an analog signal and outputs the same to the voltage control delay line 14. The voltage control delay line 14 inputs the analog signal and the reference signal (Fr) from the loop filter 13 and outputs the output signal (Fo) as the signal where the reference signal is delayed by the delay time controlled by the analog signal.

The delay locked loop 1 outputs the signal which is delay by one clock from the reference signal (Fr) as the output signal (Fo). Therefore, in the lock initial state, the phase frequency comparator 11 must compare the phases of the second clock of the reference signal (Fr) and the first clock of the output signal (Fo). In order to realize this operation, in the first embodiment, the control signal (S) is inputted to the phase frequency comparator 11.

Note that an edge combiner delay locked loop shown in FIG. 17 to be described later is also a delay locked loop which can be applied to the first embodiment. Details of the edge combiner delay locked loop will be described in a third embodiment to be described later.

Figure 18:
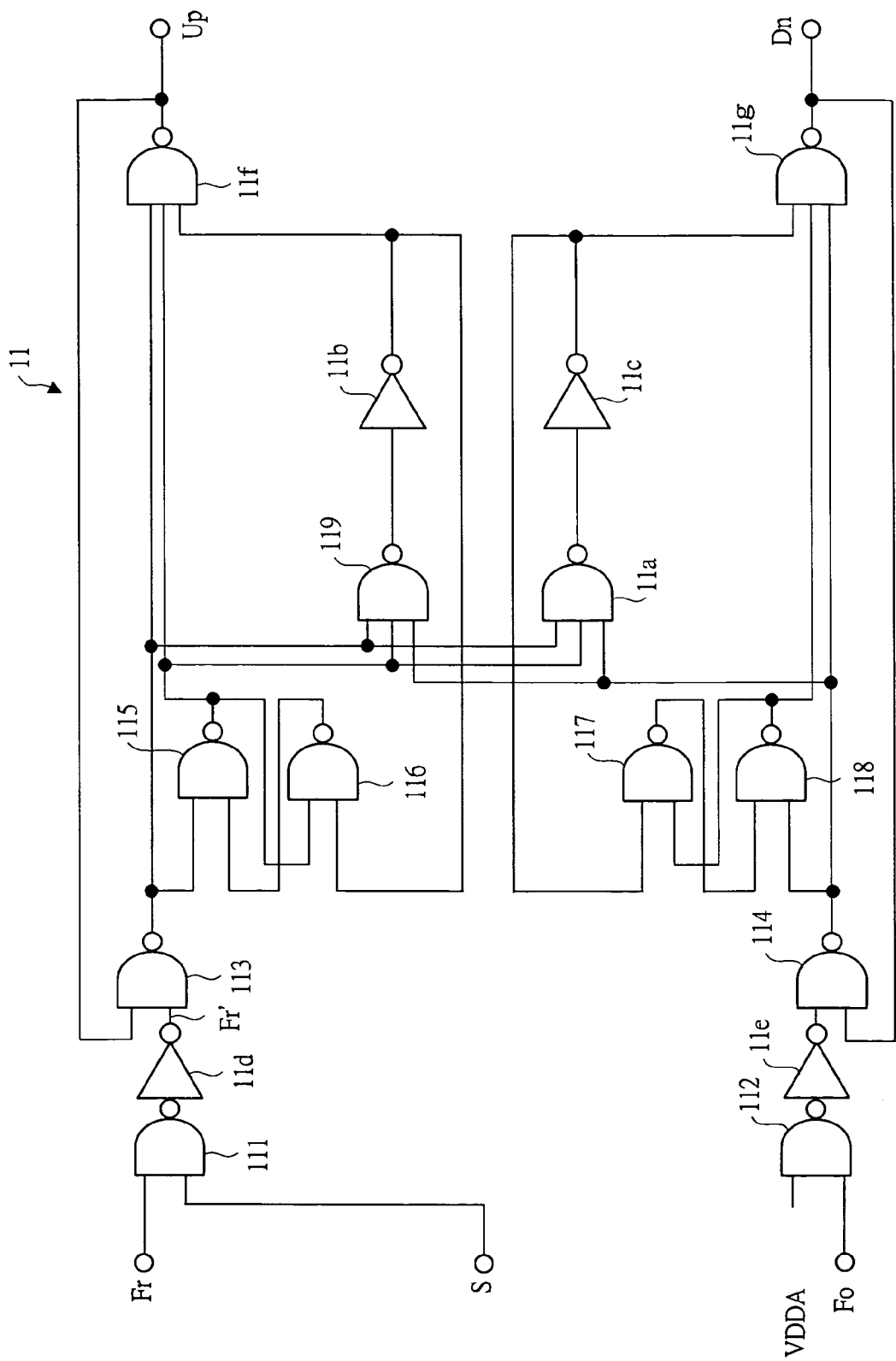
FIG. 18 is a block diagram showing a first structure example of a phase frequency comparator to be used in the delay locked loop described in FIG. 15, FIG. 16, and FIG. 17.

FIG. 18 shows a first structure example of the phase frequency comparator 11 shown in FIG. 15. With regard to the phase comparison operation of the phase frequency comparator, the above-described Patent Document 4 should be referred to. The phase frequency comparator 11 shown in FIG. 18 can shut the reference signal (Fr) by the control signal (S).

Figure 3:
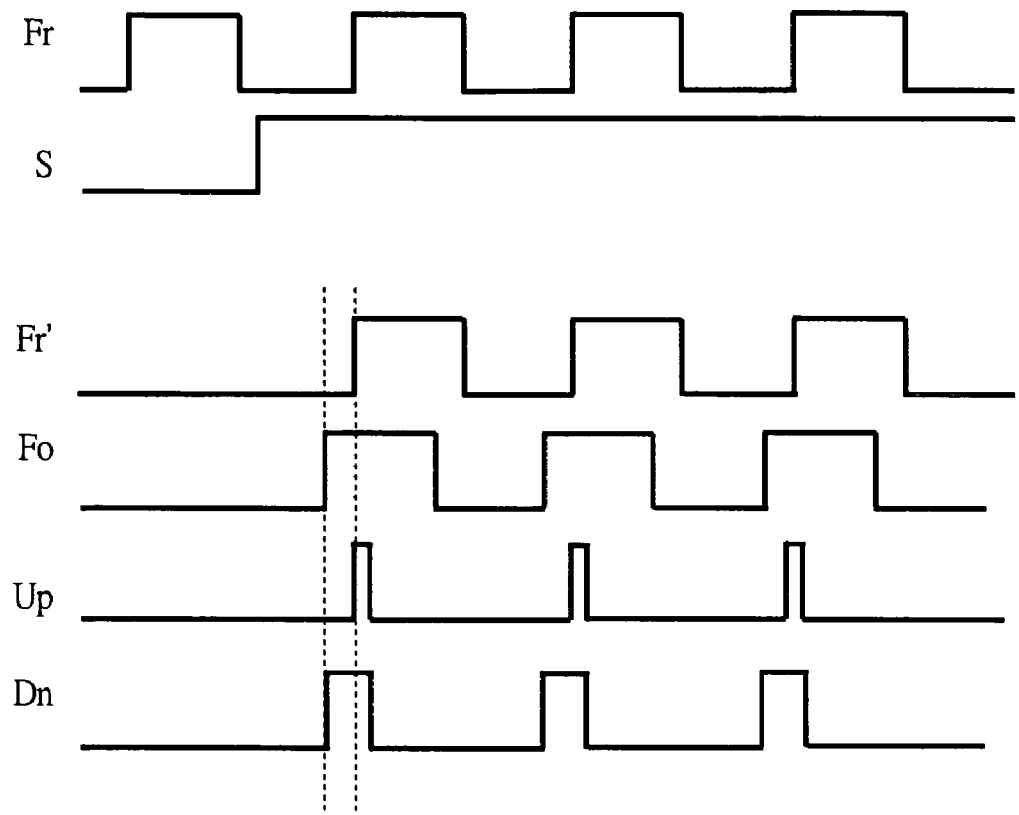
FIG. 3 is a timing chart showing the operation of a delay locked loop circuit using the first structure example of the control circuit in FIG. 2.

FIG. 3 shows the operation timing chart of the delay locked loop 1 of FIG. 15 and the phase frequency comparator 11 of FIG. 18.

Now suppose that the reference signal (Fr) has a waveform as shown in FIG. 3. At this time, suppose that the output signal (Fo) has a waveform as shown in FIG. 3. In this case, the phase frequency comparator 11 must compare the phases of the rising edge of the second clock of the reference signal and the rising edge of the first clock of the output signal. For this purpose, the phase frequency comparator 11 masks the rising edge of the first clock of the reference signal (Fr) by the control signal (S) and generates a corrected reference signal (Fr'), and then compares the phases by the corrected reference signal (Fr') and the output signal (Fo). By this means, the operation for the phase comparison of the rising edge of the second clock of the reference signal (Fr) and the rising edge of the first clock of the output signal is realized. In FIG. 18, the above-described operation is realized by inputting the reference signal (Fr) and the control signal (S) to a NAND gate 111. In FIG. 18, when the control signal (S) is low, low is outputted as the corrected output signal (Fr') which is the inverted signal of the output signal of the NAND gate 111 irrespective of the state of the reference signal (Fr). On the other hand, when the control signal (S) is high, a signal with the same phase as that of the reference signal (Fr) is outputted as the corrected output signal (Fr') which is the inverted signal of the output signal of the NAND gate 111. In FIG. 18, an inverter 11d is inserted so as to invert the output signal of the NAND gate 111, but the inverter 11d is not necessarily required. Since the delay of the NAND gate 111 and the inverter 11d is added to the corrected reference signal (Fr'), it is necessary to add the same delay to the output signal (Fo) to avoid a constant phase error. Therefore, an NAND gate 112 and an inverter 11e are provided.

Figure 2:
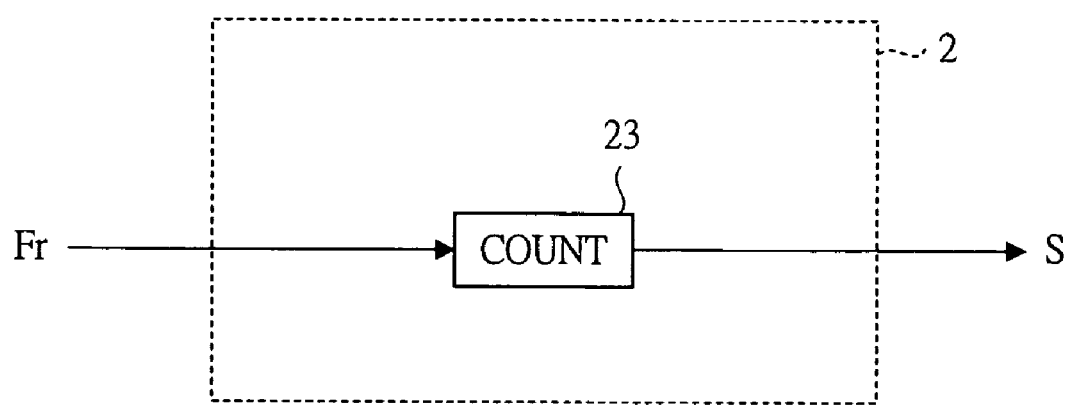
FIG. 2 is a block diagram showing a first structure example of a control circuit to be used in the delay locked loop circuit in FIG. 1.

Next, the control circuit 2 which generates the control signal (S) will be described with reference to FIG. 2. FIG. 2 shows a first structure example of the control circuit (CNT) 2 shown in FIG. 1.

This control circuit (CNT) 2 comprises a counter (COUNT) 23 and inputs the reference signal (Fr). Also, it counts the reference signal (Fr) for the preset number of counts and outputs low as the control signal (S) until a specified number of counts and outputs high as the control signal (S) when the counter reaches the specified number of counts. The sequence example shown in FIG. 3 shows that case where the control circuit 2 counts the reference signal (Fr) once and changes the polarity of the control signal (S). The counter 23 is set to output low as the control signal (S) in its initial state and counts the number of detected falling edges of the reference signal (Fr). Also, it outputs low as the control signal (S) until the number of counts becomes 1 and it outputs high as the control signal (S) when the number of counts becomes 1. Once the counter 23 enters in the operation to output high as the control signal (S), it maintains the same state. Note that the preset number of counts is not limited to 1, but 2 or higher may be used.

Since the control circuit 2 which performs the above-described operation is disposed in the outside of the loop of the delay locked loop 1, it is possible to avoid the harmonic lock of the delay locked loop without generating the constant phase error.

Figure 19:
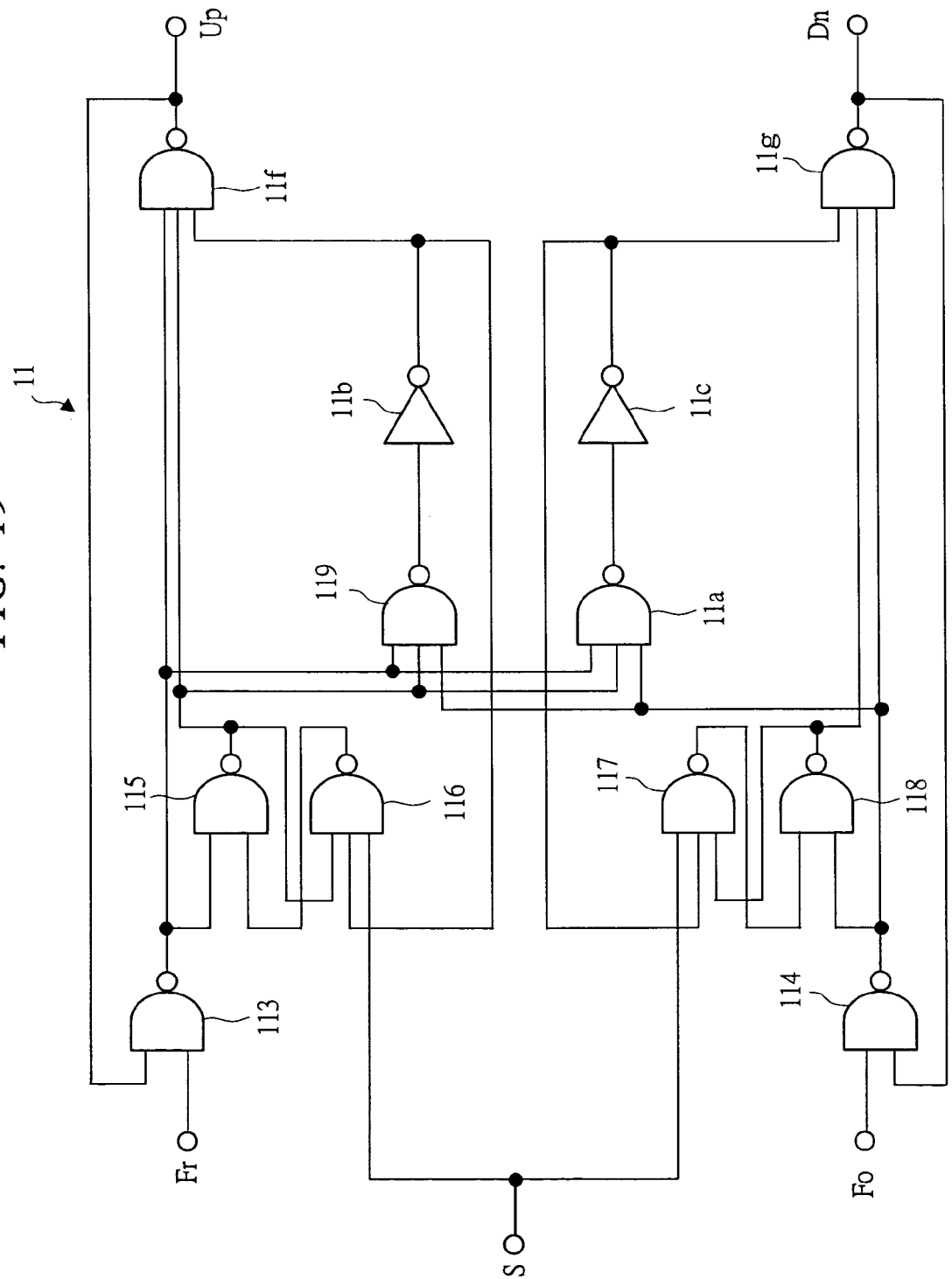
FIG. 19 is a block diagram showing a second structure example of a phase frequency comparator to be used in the delay locked loop described in FIG. 15, FIG. 16, and FIG. 17.

FIG. 19 shows a second structure example of the phase frequency comparator (PFD) 11 shown in FIG. 15. With regard to the details of the operation of the phase frequency comparator, the Patent Document 4 should be referred to.

The phase frequency comparator in FIG. 19 is a circuit which compares the phases of rising edges of the reference signal (Fr) and the output signal (Fo) and outputs the comparison result as Up and Dn, and it is a phase frequency comparator which can reset the phase comparison operation by the control signal (S).

Figure 4:
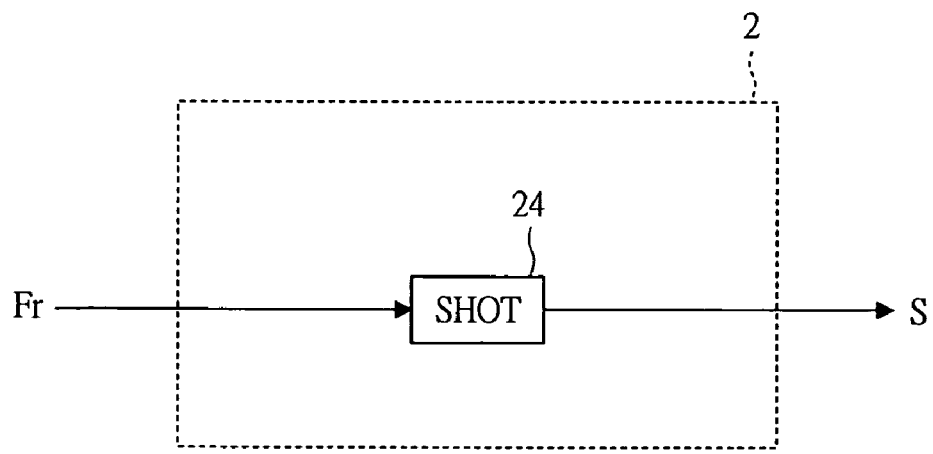
FIG. 4 is a block diagram showing a second structure example of a control circuit to be used in the delay locked loop circuit in FIG. 1.

FIG. 4 shows a second structure example of the control circuit (CNT) 2 shown in FIG. 1. The control circuit 2 shown in FIG. 4 comprises a pulse generator (SHOT) 24 and inputs the reference signal (Fr). Also, it outputs the pulse signal as the control signal (S) when the first rising edge of the reference signal (Fr) is detected and maintains a constant value after that.

Figure 6:
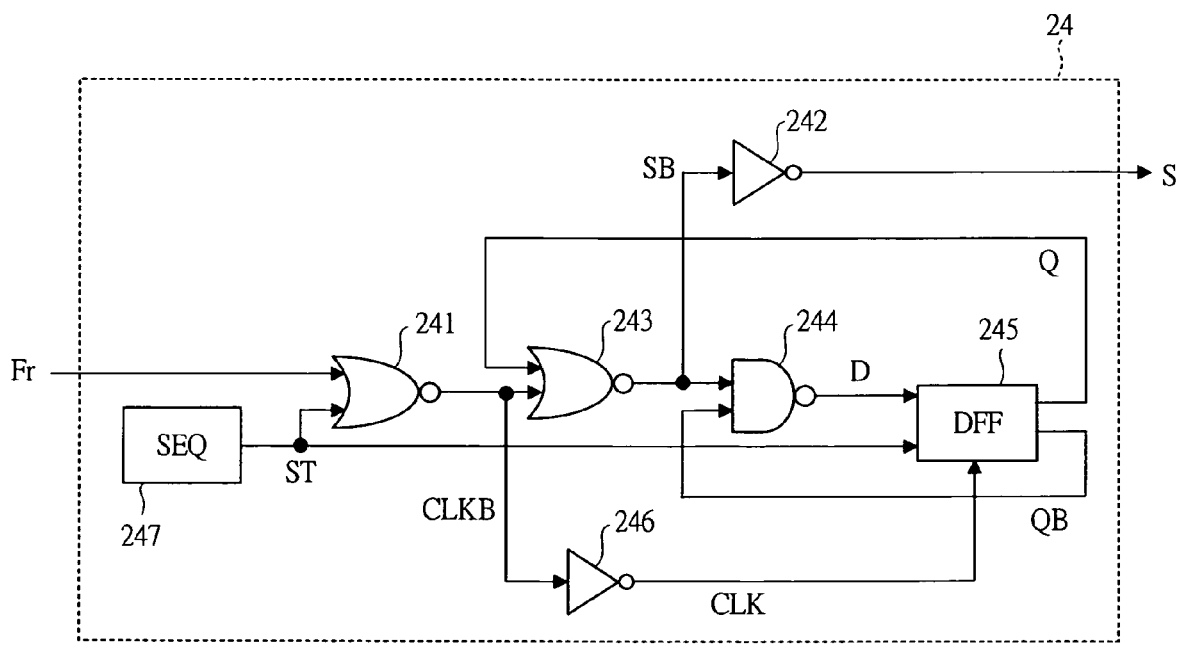
FIG. 6 is a block diagram showing a structure example of a pulse generator to be used in the second structure example of the control circuit in FIG. 4.

FIG. 6 shows a structure example of the pulse generator (SHOT) 24 shown in FIG. 4. The pulse generator (SHOT) 24 shown in FIG. 6 is composed of a standby sequence circuit (SEQ) 247, NOR gates 241 and 243, an NAND gate 244, a D flip flop (DFF) 245, inverters 242 and 246 and others. The pulse generator 24 in FIG. 6 operates when the standby signal (ST) outputted from the standby sequence circuit 247 is low and does not operate when it is high.

Figure 28:
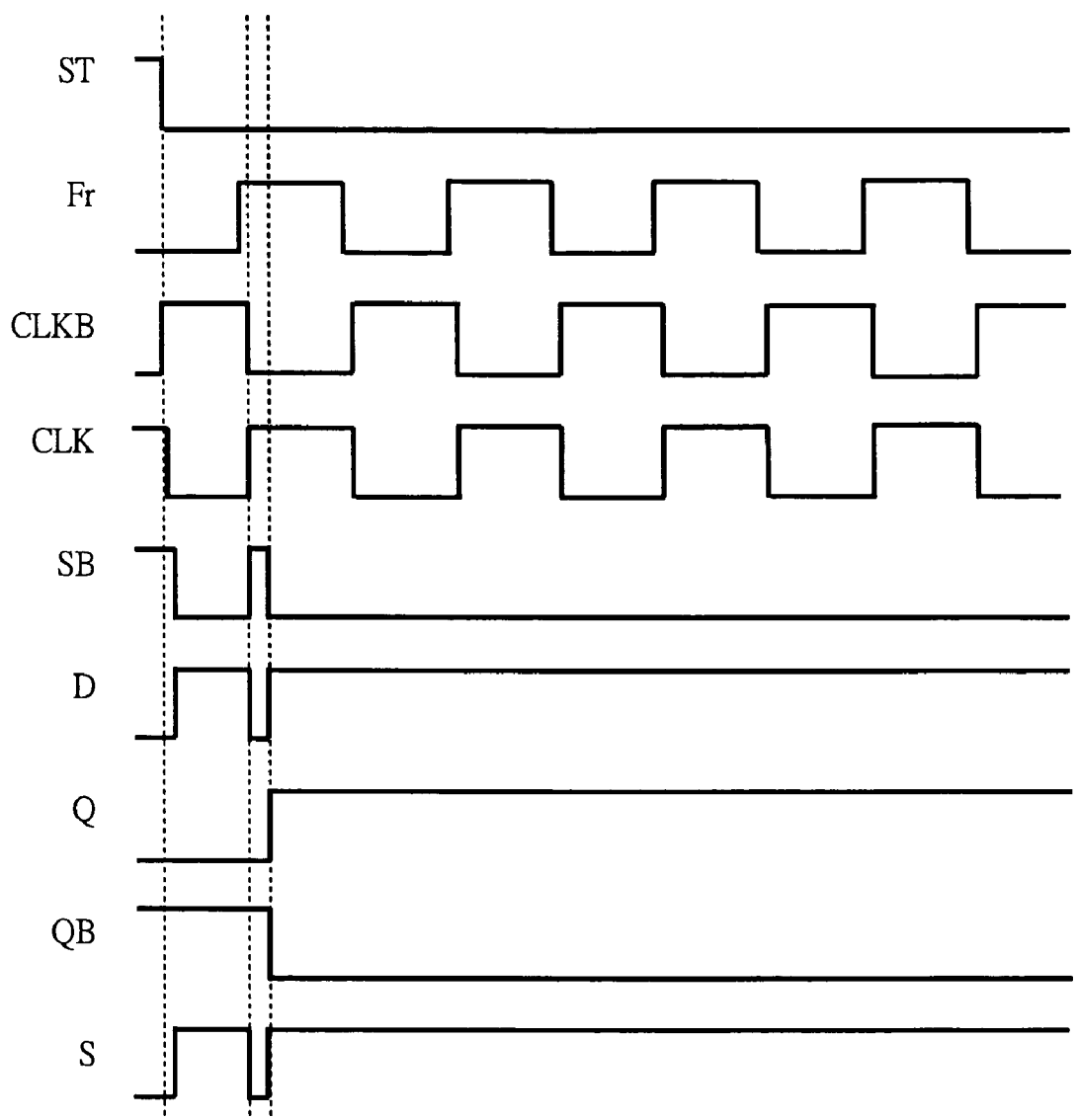
FIG. 28 is a timing chart showing the operation of a pulse generator in FIG. 6.

FIG. 28 shows an operation timing chart of the pulse generator (SHOT) 24 in FIG. 6. In the pulse generator (SHOT) 24 in FIG. 6, when the standby signal (ST) is high, the output signal (CLKB) of the NOR gate 241 is low, the output signal (Q) of the D flip flop (DFF) 245 is low, and the inverted output signal (QB) is high. Therefore, the output signal (D) of the NAND gate 244 is low, the output signal (SB) of the NOR gate 243 is high, and the control signal (S) is low.

Next, suppose that the standby signal (ST) transits from high to low. At this time, as shown in FIG. 28, for example when the reference signal (Fr) is low, the output signal (CLKB) of the NOR gate 241 becomes high and the output signal (CLK) of the inverter 246 becomes low. By the transition of these signals, the output signal (SB) of the NOR gate 243 transits from high to low, the output signal (D) of the NAND gate 244 transits from low to high, and the control signal (S) transits from low to high.

Next, the reference signal (Fr) transits from low to high. At this time, the signal (CLKB) transits from high to low. Since the signal (Q) remains low, the signal (SB) transits from low to high and the control signal (S) transits from high to low. Further, since the signal (QB) remains high, the signal (D) transits from high to low.

On the other hand, the signal (CLK) transits from low to high. The D flip flop (DFF) 245 operates so as to maintain the state of the signal (D) at the time when the signal (CLK) transits from low to high. When the signal (CLK) transits from low to high, the signal (D) still remains high. This is because the delay time of the inverter 246 is shorter than the total delay time of the NOR gate 243 and the NAND gate 244. At this time, the signal (Q) outputs high and the signal (QB) outputs low. However, the circuit delay of the D flip flop (DFF) 245 is larger than that of other circuit, and in comparison with the transition time of the signal (CLK) from low to high, the transition of the signal (Q) from low to high and the transition of the signal (QB) from high to low delay by the delay time of the D flip flop (DFF) 245. At this time, since the time when the signal (CLKB) transits to low and the time when the signal (Q) transits from low to high are shifted from each other in the NOR gate 243, the signal (SB) generates a pulse signal with the time difference between the transition time when the signal (CLKB) transits from high to low and the transition time when the signal (Q) transits from low to high as its pulse width. Therefore, the control signal (S) outputs a pulse signal. On the other hand, the signal (D) also generates a pulse signal.

Next, when the reference signal (Fr) transits from high to low, the signal (CLKB) transits from low to high and the signal (CLK) transits from high to low. However, since the signal (Q) is high, the signal (SB) remains low and the signal (S) remains high. Further, since the signal (QB) is low, the signal (D) remains high. Also, since there is no change in the output signal of the D flip flop (DFF) 245 at the falling edge of the signal (CLK), the signal (Q) and the signal (QB) maintain high and low, respectively.

Next, when the reference signal (Fr) transits from low to high, the signal (CLKB) transits from high to low and the signal (CLK) transits from low to high. However, since the signal (Q) is high, the signal (SB) remains low and the signal (S) remains high. Further, since the signal (QB) is low, the signal (D) remains high. Also, since the output signal of the D flip flop (DFF) 245 maintains the signal (D) at the rising edge of the signal (CLK), the signal (Q) and the signal (QB) maintain high and low, respectively.

Accordingly, even when the reference signal (Fr) transits thereafter, the control signal (S) continues to output high. As a result, the pulse generator 24 shown in FIG. 6 detects the first rising edge of the reference signal (Fr) and outputs one shot pulse signal, and thereafter, it generates the control signal (S) which continues to maintain high.

Figure 5:
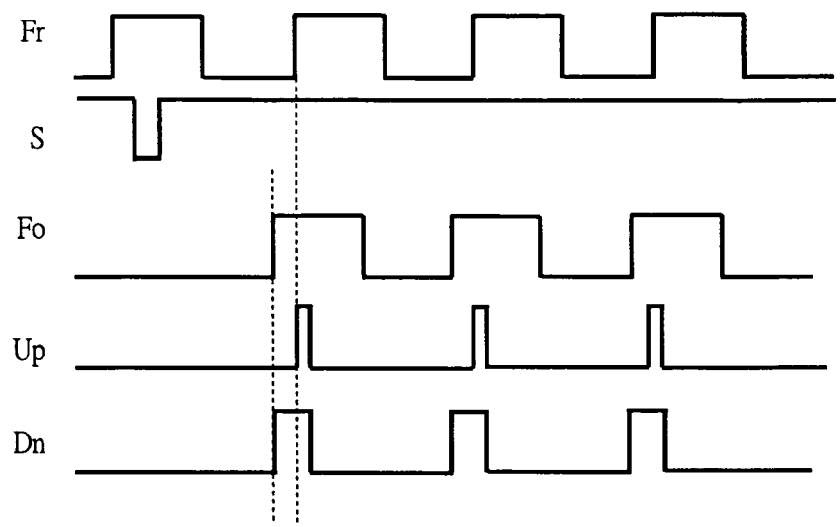
FIG. 5 is a timing chart showing the operation of a delay locked loop circuit using the second structure example of the control circuit in FIG. 4.

FIG. 5 shows an operation of the circuit shown in FIG. 6. Now suppose that when the standby signal (ST) is low, the reference signal (Fr) is inputted to the pulse generator 24 with the waveform shown in FIG. 5. At this time, suppose that the pulse generator 24 sets the control signal (S) high as its initial state. When the pulse generator 24 detects the first rising edge of the reference signal (Fr), it outputs a pulse, and thereafter, it operates to maintain the control signal (S) high.

At this time, the phase frequency comparator 11 of the second structure example shown in FIG. 19 performs the operation as shown in FIG. 5. That is, as signals to be comparison objectives, the reference signal (Fr) and the output signal (Fo) are inputted to the phase frequency comparator 11. At this time, the rising edge of the first clock of the reference signal (Fr) and the rising edge of the first clock of the output signal (Fo) become the phase comparison objectives, but when the control signal (S) outputs a pulse by inputting the control signal (S), the phase comparison operation of the phase frequency comparator 11 is once reset. At this time, the phases of the first rising edges of the reference signal (Fr) and the output signal (Fo) after receiving the pulse of the control signal (S) are compared.

Further, in the delay locked loop (DLL) 1 shown in FIG. 1, since the rising edge of the first clock of the output signal (Fo) is always outputted at slower timing than that of the rising edge of the reference signal (Fr) in an initial state, if the control signal (S) is outputted at the timing shown in FIG. 5, the phase comparison operation is always reset and the operation to compare the phases of the second clock of the reference signal (Fr) and the first clock of the output signal (Fo) is performed.

Since the control circuit (CNT) 2 which performs the above-described operation is disposed in the outside of the loop of the delay locked loop (DLL) 1, it is possible to avoid harmonic lock of the delay locked loop without generating a constant phase error.

Figure 16:
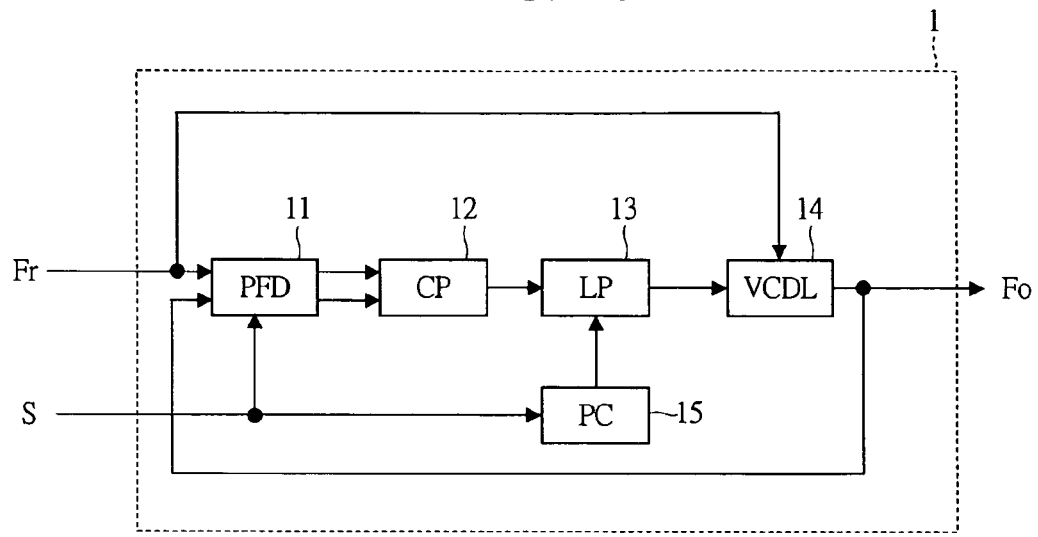
FIG. 16 is a block diagram showing a second structure example of a delay locked loop to be used in the delay locked loop circuit described in FIG. 1, FIG. 7, and FIG. 11.

FIG. 16 shows a second structure example of the delay locked loop 1 shown in FIG. 1. The difference from the first structure example shown in FIG. 15 is that a precharge 15 (PC) is provided. The precharge 15 inputs the control signal (S) and outputs signals to the loop filter 13. By precharging the loop filter 13 by the precharge 15, the output signal level of the loop filter 13 in an operation initial state in the delay locked loop 1 can be made high and the lock time can be shortened. The operation at the time when the control signal (S) shown in FIG. 3 is inputted to the delay locked loop of the second structure example shown in FIG. 16 will be described below.

When the control signal (S) is low, the precharge 15 continues to charge the electric charge to the loop filter 13. At this time, the output signal level of the loop filter 13 becomes high, and if the time when the control signal (S) is low is sufficiently long, the output signal level of the loop filter 13 increases to the power supply voltage. When the control signal (S) transits from low to high, the precharge 15 stops charging the electric charge.

By performing such an operation, the delay locked loop of the second structure example shown in FIG. 16 can shorten the lock time.

Second Embodiment

Figure 7:
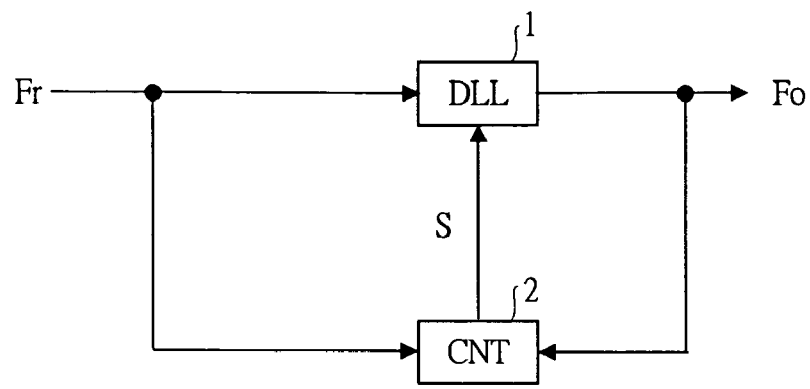
FIG. 7 is a block diagram showing a structure example of a delay locked loop circuit according to a second embodiment of the present invention.

FIG. 7 shows the structure of a delay locked loop circuit according to a second embodiment of the present invention.

The delay locked loop circuit according to the second embodiment is composed of, for example, a delay locked loop (DLL) 1 and a control circuit (CNT) 2 and others.

The delay locked loop (DLL) 1 inputs the reference signal (Fr) and the control signal (S) and outputs the output signal (Fo). The control circuit 2 inputs the reference signal (Fr) and the output signal (Fo) and outputs the control signal (S).

Figure 17:
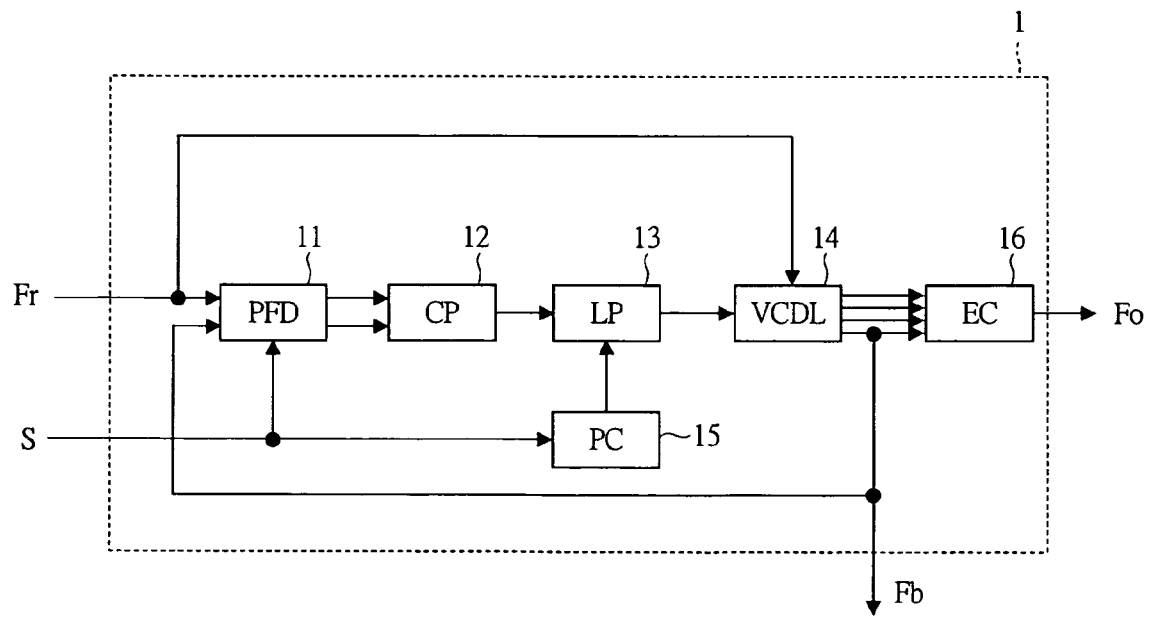
FIG. 17 is a block diagram showing a third structure example of a delay locked loop to be used in the delay locked loop circuit described in FIG. 1, FIG. 8, and FIG. 11.

As the delay locked loop 1 shown in FIG. 7, the delay locked loops shown in FIG. 15, FIG. 16, and FIG. 17 described in the first embodiment can be applied. The edge combiner delay locked loop described in FIG. 17 can be applied to this embodiment by outputting the feedback signal (Fb) to the control circuit 2.

Figure 9:
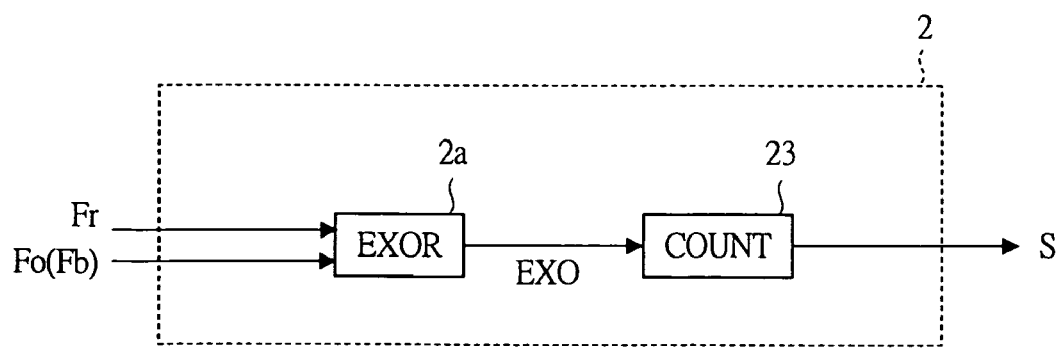
FIG. 9 is a block diagram showing a structure example of a control circuit to be used in the delay locked loop circuits in FIG. 7 and FIG. 8.

FIG. 9 shows a structure example of the control circuit 2 shown in FIG. 7.

The control circuit 2 shown in FIG. 9 comprises an exclusive OR circuit (EXOR) 2a and a counter (COUNT) 23. The exclusive OR circuit 2a inputs the reference signal (Fr) and the output signal (Fo) and outputs an exclusive OR signal (EXO) to the counter 23, and the counter 23 counts the falling edge of the exclusive OR signal (EXO) until the number of counts reach a preset number. Also, the counter 23 outputs low as the control signal (S) until it reaches a specified number of counts, and it outputs high as the control signal (S) when it reaches the specified number of counts.

Figure 10:
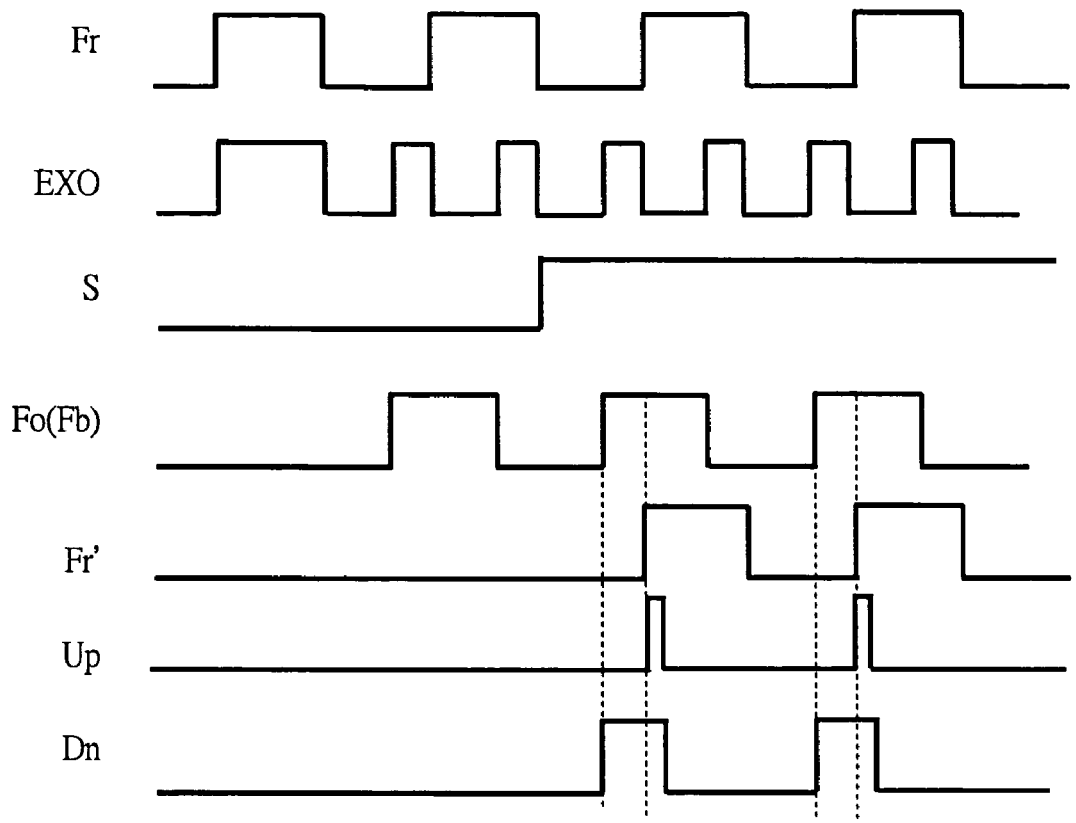
FIG. 10 is a timing chart showing the operation of a delay locked loop circuit using the control circuit in FIG. 9.

FIG. 10 shows an operation example of the delay locked loop circuit shown in FIG. 7 to which the control circuit 2 shown in FIG. 9 is applied. In the operation example shown in FIG. 10, the control circuit 2 counts the falling edge of the exclusive OR signal (EXO) three times and then changes the polarity of the control signal (S).

Now suppose that the reference signal (Fr) and the output signal (Fo) have waveforms as shown in FIG. 10. When these signals are inputted to the exclusive OR circuit (EXOR) 2a, an exclusive OR signal (EXO) such as shown in FIG. 10 is outputted.

The counter 23 is set to output low as the control signal (S) in its initial state and counts the number of detected falling edges of the reference signal (Fr). Also, it outputs low as the control signal (S) until the number of counts becomes 3 and it outputs high as the control signal (S) when the number of counts becomes 3. Once the counter 23 enters in the operation to output high as the control signal (S), it maintains the same state.

Since the control circuit 2 which performs the above-described operation is disposed in the outside of the loop of the delay locked loop 1, it is possible to avoid the harmonic lock of the delay locked loop without generating the constant phase error.

Third Embodiment

Figure 8:
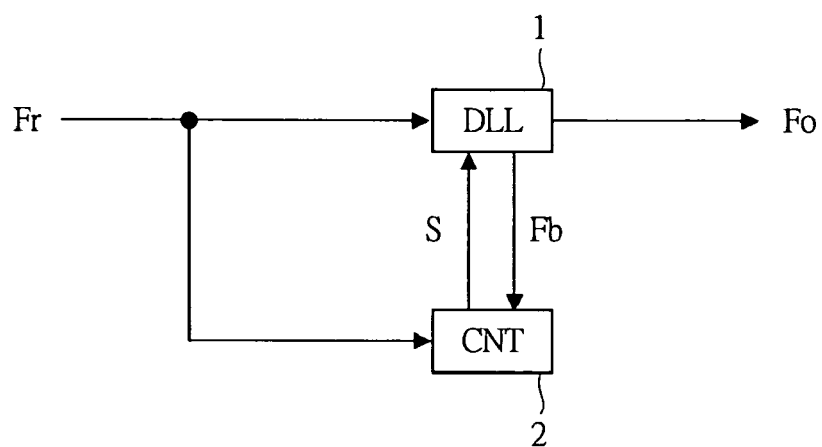
FIG. 8 is a block diagram showing a structure example of a delay locked loop circuit according to a third embodiment of the present invention.

FIG. 8 shows the structure example of a delay locked loop circuit according to a third embodiment of the present invention. The third embodiment is a modified example of the second embodiment described above.

The delay locked loop circuit according to the third embodiment is composed of, for example, a delay locked loop (DLL) 1 and a control circuit (CNT) 2 and others.

The delay locked loop (DLL) 1 inputs the reference signal (Fr) and the control signal (S) and outputs the feedback signal (Fb) and the output signal (Fo). The control circuit 2 inputs the reference signal (Fr) and the feedback signal (Fb) and outputs the control signal (S).

FIG. 17 shows a structure example of the delay locked loop 1 described in FIG. 8.

The delay locked loop 1 shown in FIG. 17 is composed of a phase frequency comparator (PFD) 11, a charge pump (CP) 12, a loop filter (LF) 13, a voltage control delay line (VCDL) 14, a precharge (PC) 15, and an edge combiner (EC) 16.

The phase frequency comparator 11 inputs the reference signal (Fr), the feedback signal (Fb), and the control signal (S) and outputs a comparison signal of the reference signal (Fr) and the feedback signal (Fb) to the charge pump 12. The charge pump 12 outputs a pulse signal in accordance with the comparison signal to the loop filter 13. The loop filter 13 converts the pulse signal into an analog signal and outputs the same to the voltage control delay line 14. The voltage control delay line 14 inputs the reference signal and the analog signal and outputs signals with respective phases obtained by delaying the phase of the reference signal by the delay time controlled by the analog signal.

In FIG. 17, the voltage control delay line 14 outputs four kinds of phase signals. The signal whose phase is delayed most with respect to the reference signal is inputted as the feedback signal (Fb) to the phase frequency comparator 11. On the other hand, output signals with respective phases of the voltage control delay line 14 are inputted to the edge combiner 16 (EC). The edge combiner adds the respective signals with different phases and generates the output signal (Fo) having the frequency of constant times the reference signal (Fr).

As the control circuit 2 shown in FIG. 8, the control circuit shown in FIG. 9 can be applied. Since the details of the operation in the third embodiment are identical to those in the above-described first embodiment and second embodiment, description thereof is omitted herein.

According to the third embodiment, the same effect as that in the above-described first embodiment and second embodiment can be attained.

Fourth Embodiment

Figure 11:
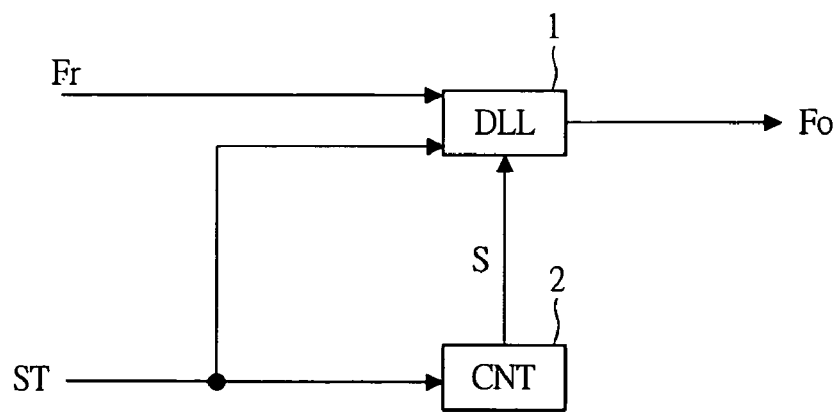
FIG. 11 is a block diagram showing a structure example of a delay locked loop circuit according to a fourth embodiment of the present invention.

FIG. 11 shows the structure of a delay locked loop circuit according to a fourth embodiment of the present invention.

The delay locked loop circuit according to the fourth embodiment is composed of, for example, a delay locked loop (DLL) 1 and a control circuit (CNT) 2 and others.

The delay locked loop (DLL) 1 inputs the reference signal (Fr), the control signal (S), and the standby signal (ST) and outputs the output signal (Fo). The control circuit 2 inputs the reference signal (Fr), the feedback signal (Fb), and the standby signal (ST) and outputs the control signal (S).

The standby signal (ST) is the signal which defines the operation state of the delay locked loop 1. For example, when the standby signal (ST) is high, the delay locked loop 1 performs its normal operation, and when it is low, the delay locked loop 1 is in its standby operation.

Figure 12:
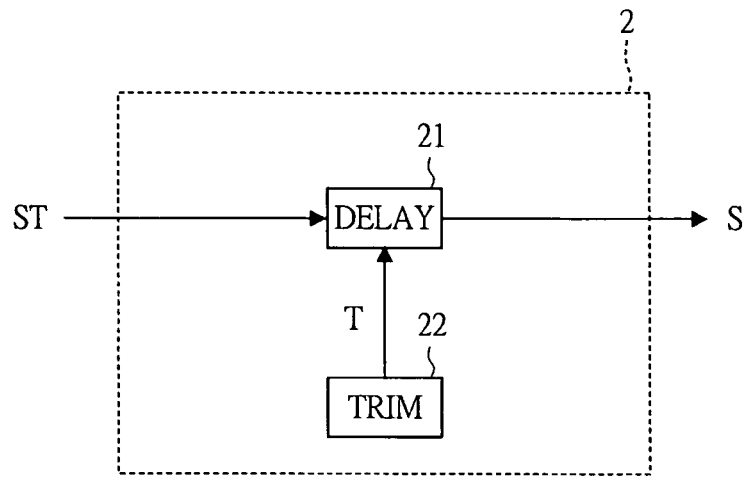
FIG. 12 is a block diagram showing a structure example of a control circuit to be used in the delay locked loop circuit in FIG. 11.
Figure 14:
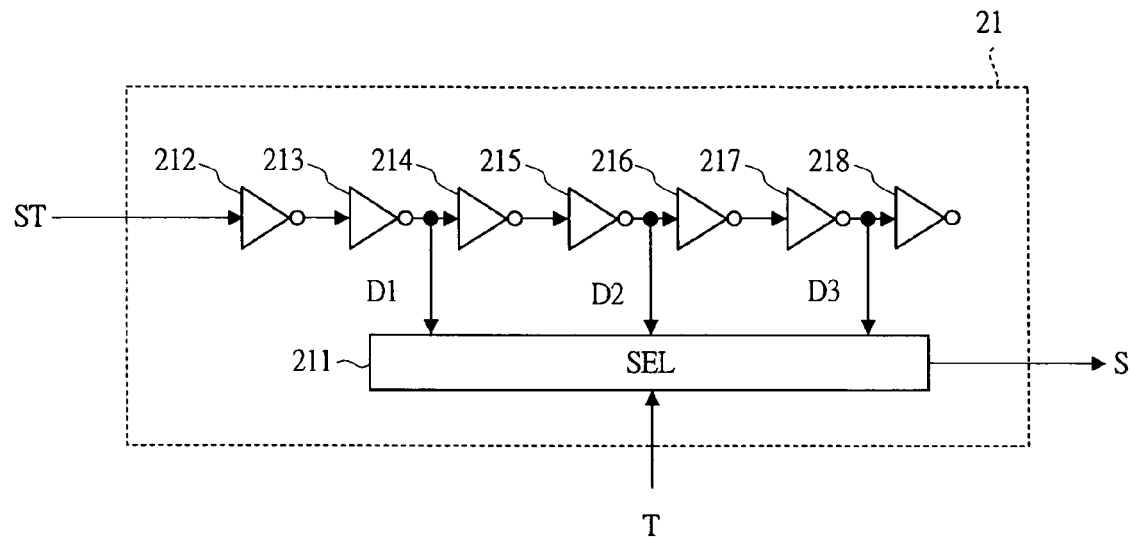
FIG. 14 is a block diagram showing a structure example of a delay circuit to be used in the control circuit in FIG. 12.

FIG. 12 shows a structure example of the control circuit 2 described in FIG. 11. Also, FIG. 14 shows the structure of a delay circuit 21 shown in FIG. 12.

The control circuit 2 shown in FIG. 12 comprises a delay circuit (DELAY) 21 and a trimming unit (TRIM) 22, and the delay circuit 21 to which the standby signal (S) and a trimming signal (T) are inputted outputs the signal obtained by delaying the standby signal (ST) by the delay time set by the trimming signal (T) as the control signal (S).

Figure 13:
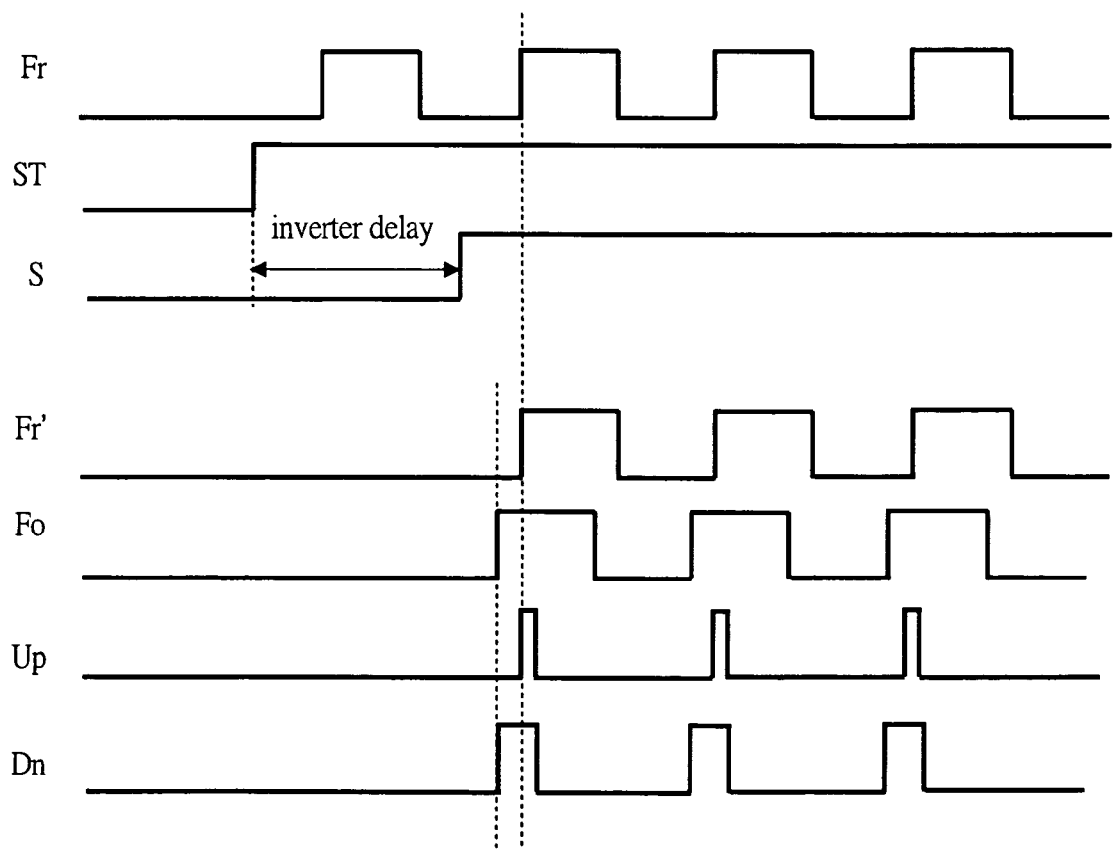
FIG. 13 is a timing chart showing the operation of a delay locked loop circuit using the control circuit in FIG. 12.

FIG. 13 shows an operation example of the delay locked loop circuit shown in FIG. 11, using the control circuit 2 shown in FIG. 12.

When the standby signal (ST) is low, the reference signal (Fr) is not a clock signal but a constant signal. When the standby signal (ST) becomes high, the reference signal becomes a clock signal and is inputted to the delay locked loop 1. Further, the standby signal (ST) is inputted also to the control circuit 2. In the control circuit, the rising edge of the standby signal (ST) is delayed so as to be between the first falling edge of the reference signal (Fr) and the second rising edge thereof, and it is outputted as the control signal (S) to the delay locked loop. This delay time is controlled by the trimming signal (T). The delay locked loop 1 to which the control signal (S) is inputted can perform the normal operation as shown in FIG. 13.

Fifth Embodiment

A semiconductor integrated circuit device according to a fifth embodiment of the present invention is a semiconductor integrated circuit device to which the delay locked loop circuit according to the above-described first to fourth embodiments is applied.

Figure 25:
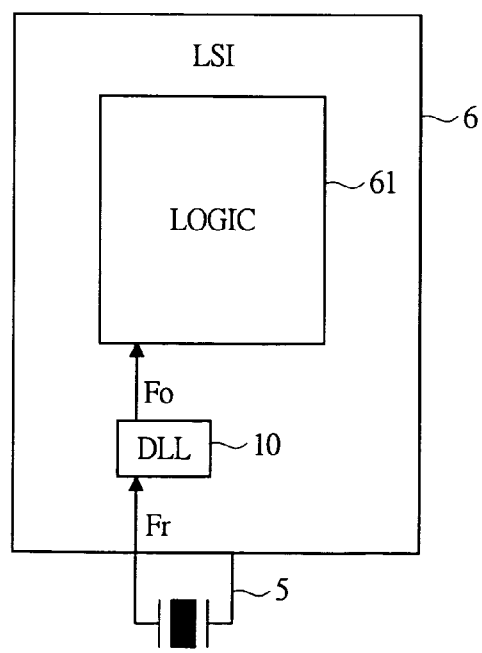
FIG. 25 is a block diagram showing a structure of a semiconductor integrated circuit device according to a fifth embodiment of the present invention.

FIG. 25 shows the structure of the semiconductor integrated circuit device (LSI) according to the fifth embodiment of the present invention.

The semiconductor integrated circuit device (LSI) 6 according to the fifth embodiment is composed of, for example, a logic circuit (LOGIC) 61 and a delay locked loop (DLL) circuit 10 and others.

The reference signal (Fr) is inputted from an oscillator 5 disposed on the outside of the semiconductor integrated circuit device 6 to a delay locked loop circuit 10. The delay locked loop circuit 10 is a delay locked loop circuit described in the above-described first to fifth embodiments, and it generates an output signal (Fo) synchronized with the reference signal (Fr) and outputs the same to the logic circuit 61. The logic circuit 61 is a circuit which performs data calculation processing, and it operates with using the output signal (Fo) generated by the delay locked loop circuit 10 as its operating clock.

Figure 20:
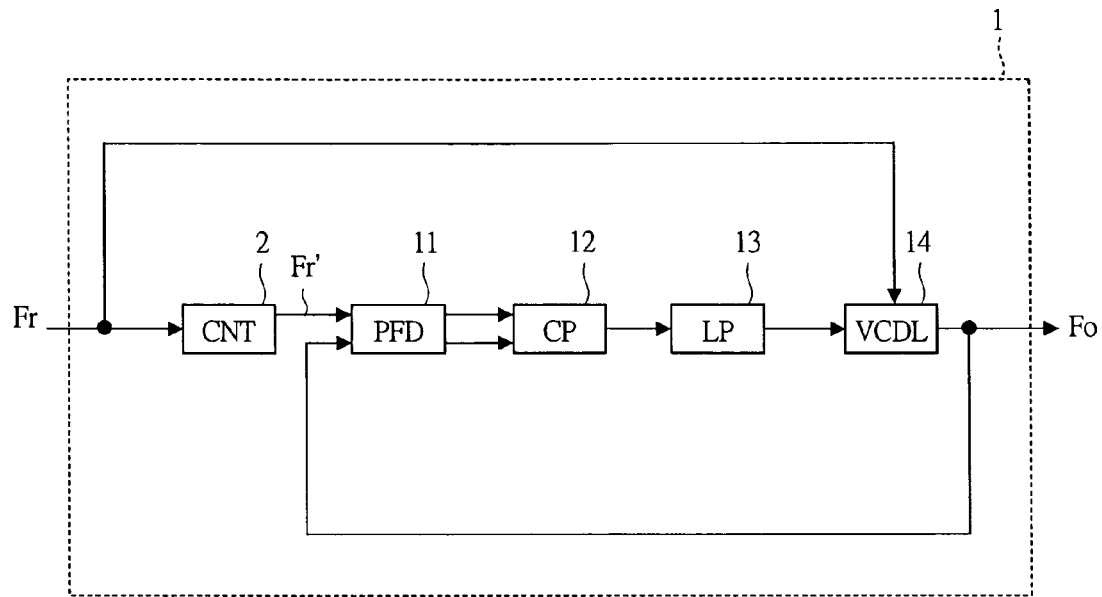
FIG. 20 is a block diagram showing a first structure example of a delay locked loop examined as the background of the present invention.
Figure 21:
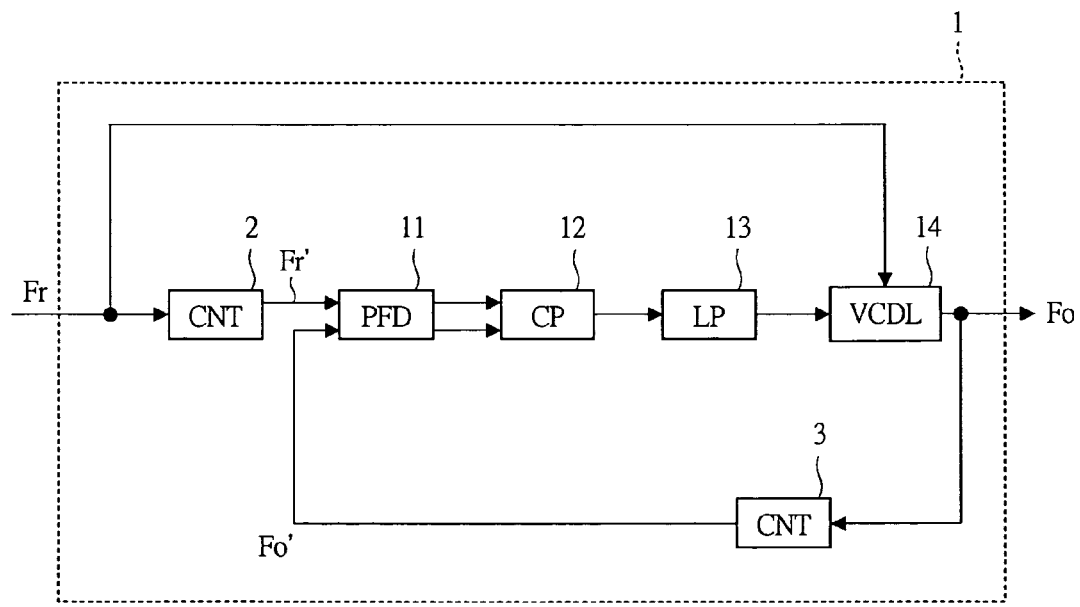
FIG. 21 is a block diagram showing a second structure example of a delay locked loop examined as the background of the present invention.
Figure 22:
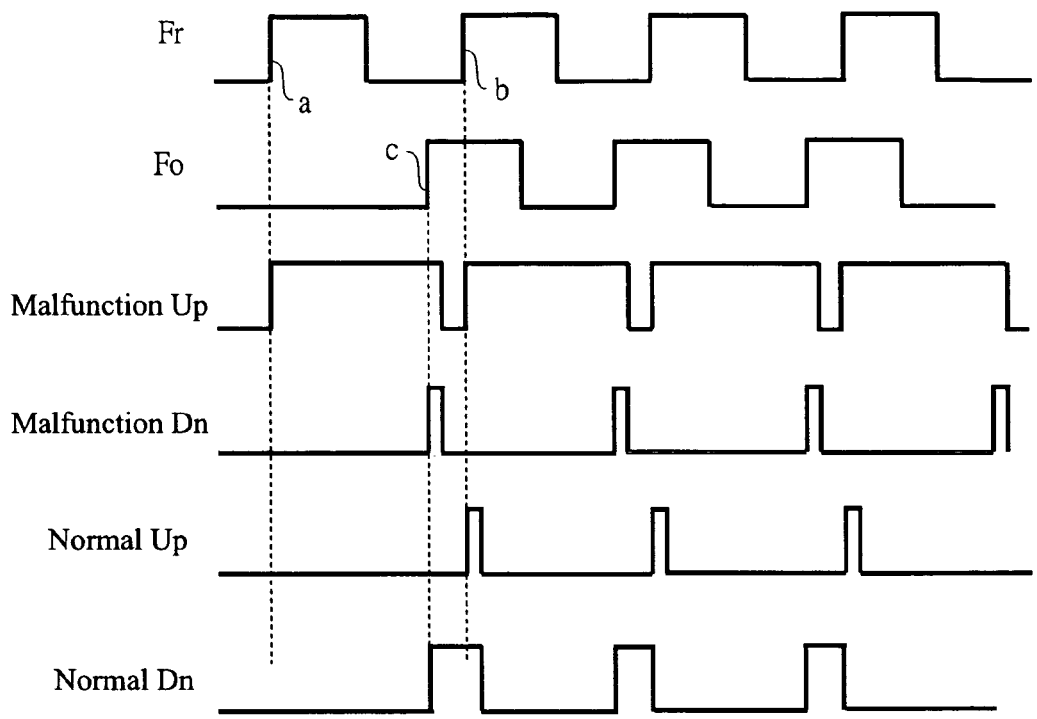
FIG. 22 is a timing chart for describing harmonic lock of a delay locked loop.
Figure 23:
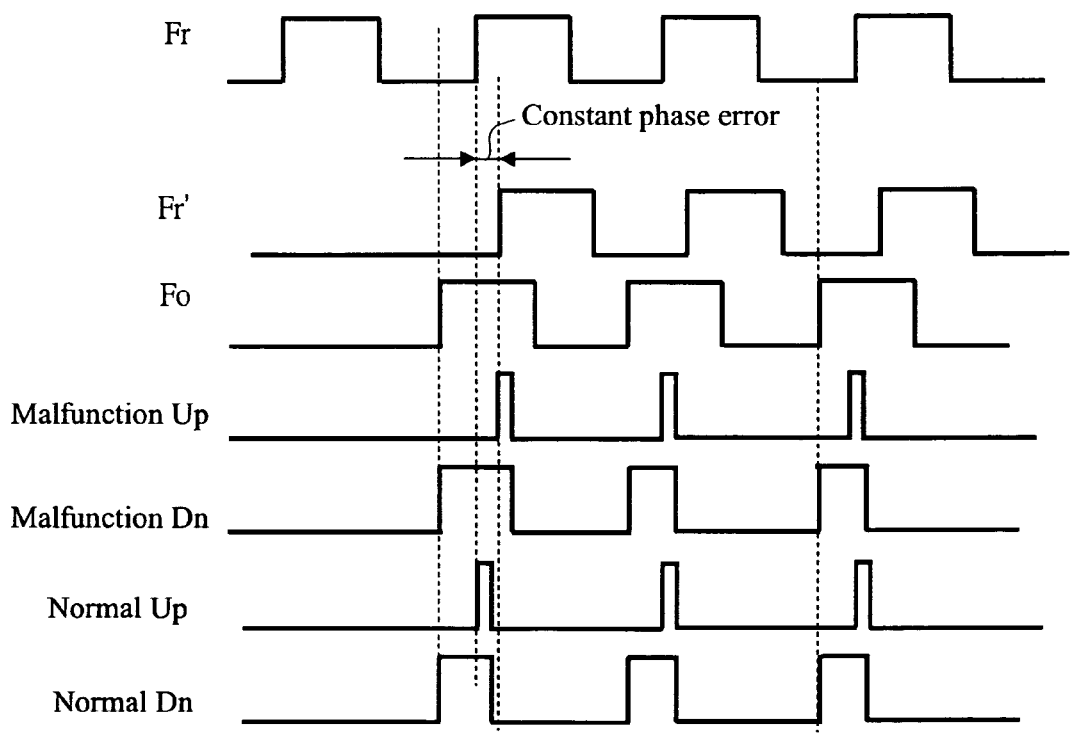
FIG. 23 is a timing chart showing the operation of a first structure example of a delay locked loop examined as the background of the present invention.
Figure 24:
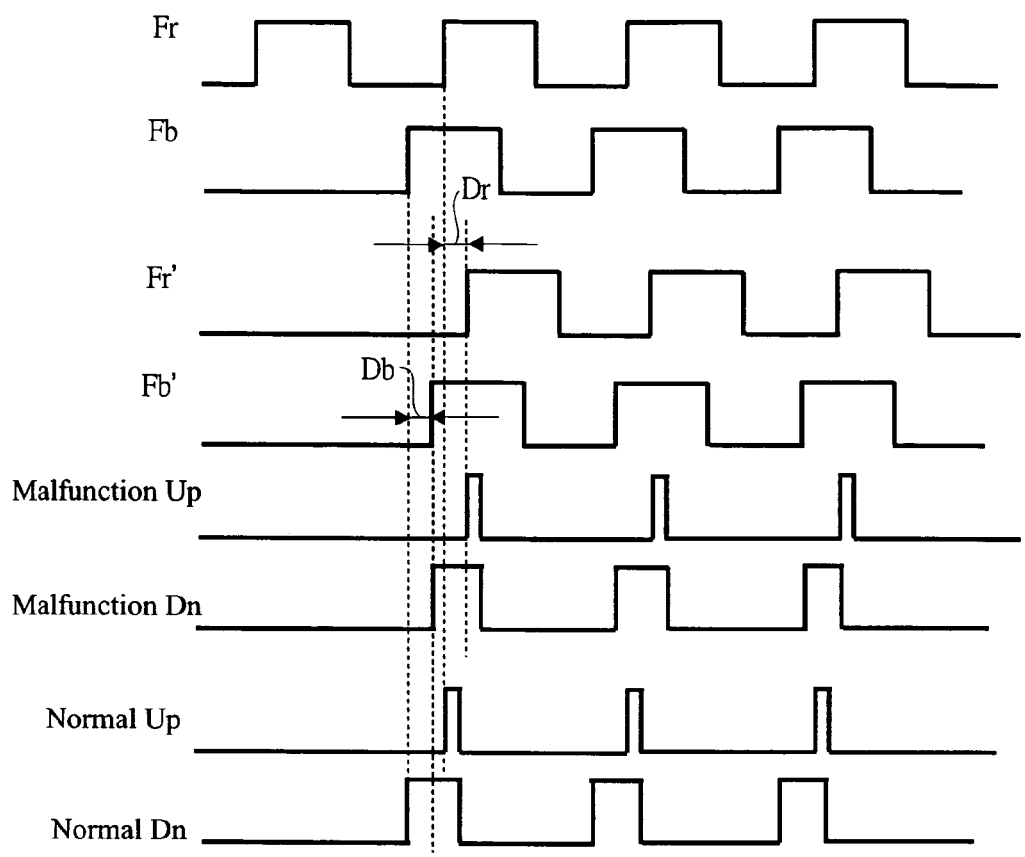
FIG. 24 is a timing chart showing the operation of a second structure example of a delay locked loop examined as the background of the present invention.

If the delay locked loop circuit described in FIG. 20 and FIG. 21 examined as the background of the present invention is used, the constant phase error occurring in the delay locked loop circuit becomes a jitter for the output signal (Fo) and narrows the operation margin of the logic circuit 61.

Further, along with the increase in speed of the output signal (Fo) of the delay locked loop circuit which determines the operation speed of the logic circuit 61 due to the increase in operation speed of semiconductor integrated circuit devices in recent years, the constant phase error occurring in the delay locked loop circuit causes malfunction of the logic circuit 61 in some cases.

Furthermore, in the semiconductor integrated circuit device in which an edge combiner type delay locked loop circuit is used as the delay locked loop circuit to generate the output signal (Fo) having multiplied frequency of the reference signal (Fr), thereby operating the logic circuit 61 at high speed, there is a fear that the output signal (Fo) cannot have a desired frequency due to the constant phase error of the delay locked circuit and the logic circuit 61 cannot operate.

Therefore, by using the delay locked loop circuit 10 according to the above-described first to fourth embodiments as shown in FIG. 25, the output signal (Fo) can be generated without generating a constant phase error. Accordingly, it becomes possible to normally operate the semiconductor integrated circuit device 6 without causing malfunction of the logic circuit 61.

Next, as an applied example of a semiconductor integrated circuit device according to the fifth embodiment, an example where the delay locked loop circuit according to the above-described first to fourth embodiments is applied to a transceiver and a system on chip will be described below.

Figure 26:
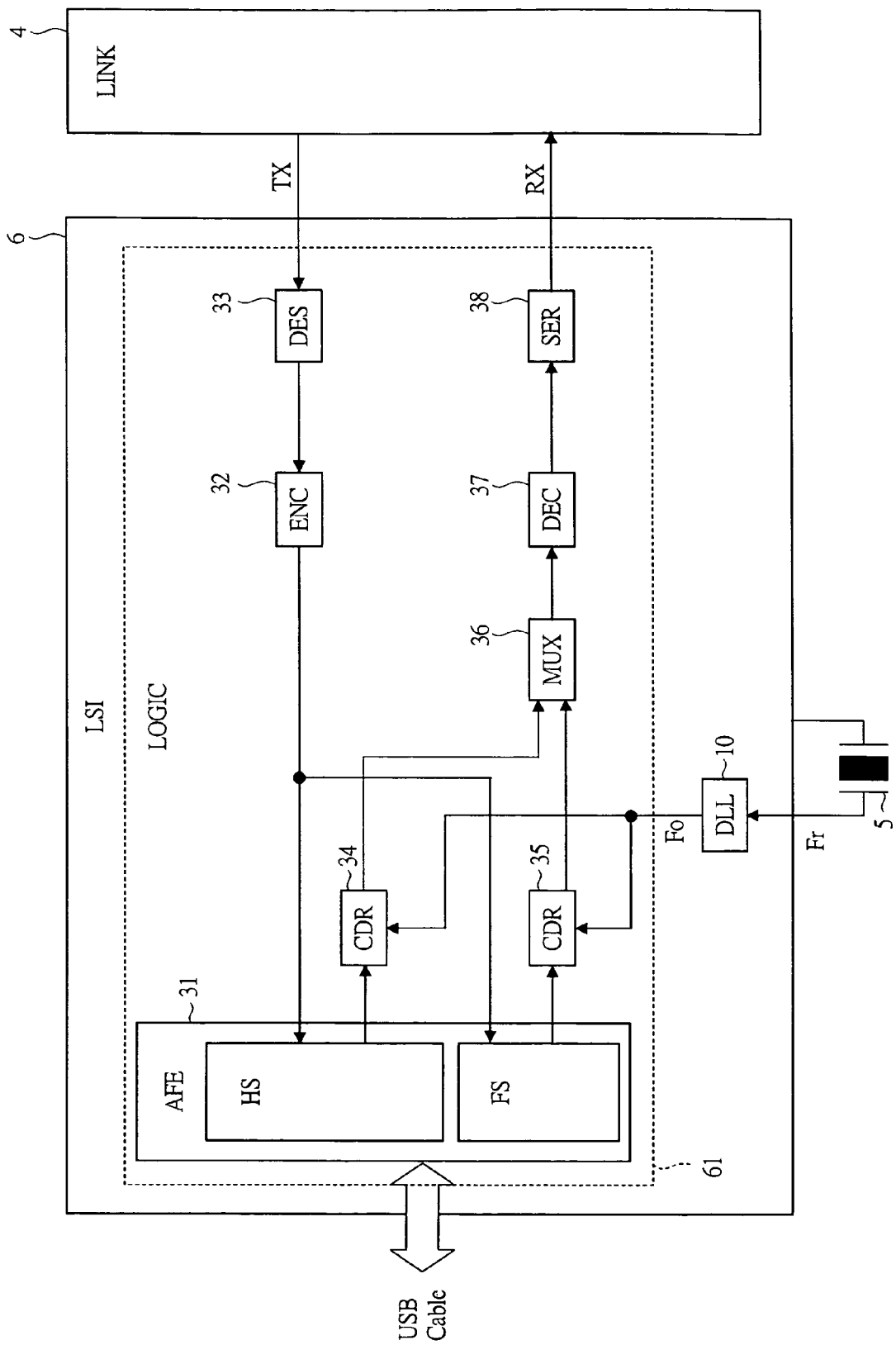
FIG. 26 is a block diagram showing a structure example of a USB transceiver as an applied example of the semiconductor integrated circuit device described in FIG. 25.

FIG. 26 shows the structure of a USB transceiver using the delay locked loop circuit according to the above-described first to fourth embodiments.

The semiconductor integrated circuit device (LSI) 6 according to the fifth embodiment is, for example, a physical layer (PHY) of an USB transceiver, and it comprises a logic circuit (LOGIC) 61 including an analog front end (AFE) 31, an encoder (ENC) 32, a deserializer (DES) 33, clock data recoveries (CDR) 34 and 35, a multiplexer (MUX) 36, a decoder (DEC) 37, a serializer (SER) 38 and others and a delay locked loop (DLL) circuit 10 and others. A transmission signal (TX) outputted from a link layer (LINK) 4 is converted from a parallel signal into a serial signal by the deserializer 33 and is processed by the encoder 32, and then outputted from the USB cable via the analog front end 31. At the time of output, two systems of paths of high speed mode (HS) and full speed mode (FS) are selected depending on the mode of the USB transceiver. On the other hand, with regard to the signal received from the USB cable, data is outputted via the analog front end 31 to the clock data recovery 34 in the case of the high speed mode (HS) and to the clock data recovery 35 in the case of the full speed mode (FS). The respective clock data recoveries 34 and 35 receive the output signal of the delay locked loop (DLL) circuit 10 which receives the output signal (Fr) of the oscillator 5 to generate the signal as a clock and synchronize the data and the clock, and then output the signal to the multiplexer 36. The multiplexer 36 outputs the selected signal to the decoder 37, and the decoder 37 processes the signal and outputs the signal to the serializer 38. The serializer 38 converts serial data into parallel data and outputs the same to the link layer 4.

In this semiconductor integrated circuit device (USB physical layer) 6, as the delay locked loop circuit which generates clock of the clock data recovery, the delay locked loop circuit described in the above-described first to fourth embodiments is optimal.

Figure 27:
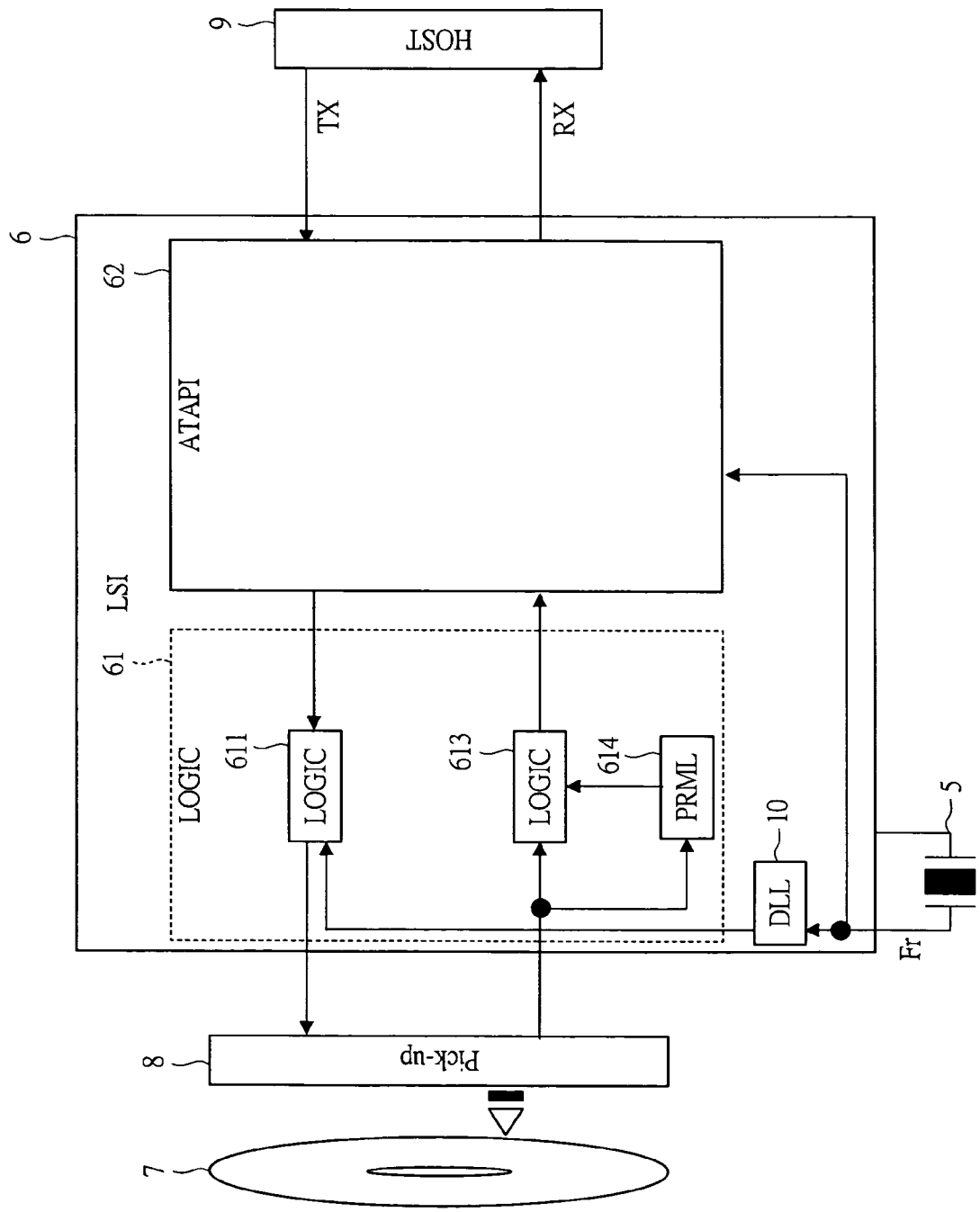
FIG. 27 is a block diagram showing a structure example of a DVD drive LSI as an applied example of the semiconductor integrated circuit device described in FIG. 25.

FIG. 27 shows the structure of a DVD drive LSI using the delay locked loop circuit according to the above-described first to fourth embodiments.

The semiconductor integrated circuit device (LSI) 6 according to the fifth embodiment is, for example, a DVD drive LSI, and it comprises a logic circuit (LOGIC) 61 of a recording and replaying unit and a transmitting and receiving unit (ATAPI) 62. A transmission signal (TX) outputted from a host (HOST) 9 is inputted via the transmitting and receiving unit 62 to a logic circuit 611 in the logic circuit 61. The transmission signal processed by the logic circuit 611 is written to a medium 7 via a pickup 8. Herein, the logic circuit 611 operates with using the clock generated by the delay locked loop circuit 10 as its operating clock. This delay locked loop circuit 10 inputs the output signal (Fr) of the oscillator 5 and generates a desired signal, and the delay locked loop circuit described in the above-described first to fourth embodiments is preferably applied thereto.

In the foregoing, the invention made by the inventor of the present invention has been concretely described based on the embodiments. However, it is needless to say that the present invention is not limited to the foregoing embodiments and various modifications and alterations can be made within the scope of the present invention.

According to the above-described embodiments of the present invention, there are obtained effects (1) it is possible to avoid malfunction of a delay locked loop, (2) the reference signal (Fr) is inputted to the phase comparator and the delay line at the same timing, and (3) it is possible to obtain a desired output signal without causing a constant phase error.

Further, the above-described embodiments of the present invention are effectively applied to manufacturing industries of semiconductor devices, electronic appliances, and the like.

What is claimed is:

1. A delay locked loop circuit comprising:
   a delay locked loop element; and
   a control circuit which outputs a control signal to control an operation of the delay locked loop element,
   wherein the delay locked loop element is configured to receive a reference signal and the control signal, and is configured to output an output signal,
   wherein the control circuit is configured to receive the reference signal and the output signal, and is configured to output the control signal,
   wherein the control circuit includes an exclusive OR circuit and a counter,
   wherein the exclusive OR circuit is configured to receive the reference signal and the output signal, and is configured to provide an output to the counter, and
   wherein the control circuit is configured to count the output of the exclusive OR circuit using the counter, to output a first set signal by which the delay locked loop element is not operated by the control signal until the number of counts of the counter reaches a set value, and to output a second set signal by which the delay locked loop element is operated by the control signal after the number of counts of the counter reaches the set value.

2. The delay locked loop circuit according to claim 1,
   wherein the delay locked loop element comprises a phase comparator,
   wherein the phase comparator is configured to receive the reference signal, the output signal, and the control signal, and
   wherein the phase comparator is configured to compare phases of the reference signal and the output signal using the control signal.

3. A delay locked loop circuit comprising:
   a delay locked loop element; and
   a control circuit which outputs a control signal to control an operation of the delay locked loop element,
   wherein the delay locked loop element is configured to receive a reference signal and the control signal, and is configured to output an output signal,
   wherein the control circuit is configured to receive the reference signal and to output the control signal,
   wherein the delay locked loop element is further configured to output a feedback signal, and the control circuit is further configured to receive the feedback signal,
   wherein the control circuit includes an exclusive OR circuit and a counter,
   wherein the exclusive OR circuit is configured to receive the reference signal and the feedback signal, and is configured to provide an output to the counter, and
   wherein the control circuit is configured to count the output of the exclusive OR circuit using the counter, to output a first set signal by which the delay locked loop element is not operated by the control signal until the number of counts of the counter reaches a set value, and to output a second set signal by which the delay locked loop element is operated by the control signal after the number of counts of the counter reaches the set value.

4. The delay locked loop circuit according to claim 3,
   wherein the delay locked loop element comprises a phase comparator,
   wherein the phase comparator is configured to receive the reference signal, the output signal, and the control signal, and
   wherein the phase comparator is configured to compare phases of the reference signal and the output signal using the control signal.

5. A delay locked loop circuit comprising:
   a delay locked loop element; and
   a control circuit which outputs a control signal to control an operation of the delay locked loop element,
   wherein the delay locked loop element is configured to receive a reference signal and the control signal, and is configured to output an output signal,
   wherein the control circuit is configured to receive the reference signal and to output the control signal,
   wherein the delay locked loop element is further configured to receive a standby signal,
   wherein the control circuit is further configured to receive the standby signal,
   wherein the control circuit includes a trimming register and a delay circuit,
   wherein the trimming register is configured to output a trimming signal to the delay circuit,
   wherein the delay circuit is configured to receive the standby signal and the trimming signal, and is configured to output the control signal, and
   wherein the delay circuit is configured to output a signal obtained by delaying the standby signal for a specified time using the trimming signal as the control signal.

* * * * *